United States Patent [19]

Vakil et al.

[11] Patent Number: 4,775,203
[45] Date of Patent: Oct. 4, 1988

[54] OPTICAL SCATTERING FREE METAL OXIDE FILMS AND METHODS OF MAKING THE SAME

[75] Inventors: Himanshu B. Vakil, Schenectady, N.Y.; John F. Ackerman, Cheyenne, Wyo.

[73] Assignee: General Electric Company, Schenectady, N.Y.

[21] Appl. No.: 14,315

[22] Filed: Feb. 13, 1987

[51] Int. Cl.[4] .......................... G02B 1/10; G02B 5/28
[52] U.S. Cl. ..................................... 350/1.7; 350/164; 350/320; 427/164; 428/623
[58] Field of Search ........................ 350/1.7, 164, 320; 357/2, 52, 61, 65; 427/43.1, 54.1, 74, 128, 163, 255.2, 256; 118/724; 526/96, 106, 125, 127

[56] References Cited

U.S. PATENT DOCUMENTS

| | | | |
|---|---|---|---|
| 2,920,002 | 1/1960 | Auwarter | 350/164 |
| 2,932,592 | 4/1960 | Cameron | 350/164 |
| 3,984,581 | 10/1976 | Dobler et al. | 350/164 |
| 4,137,865 | 2/1979 | Cho | 118/724 |
| 4,393,097 | 7/1983 | Hirai et al. | 427/255.2 |
| 4,431,708 | 2/1984 | Carver et al. | 350/1.7 |
| 4,435,445 | 3/1984 | Allred et al. | 427/54.1 |
| 4,508,054 | 4/1985 | Baumberger et al. | 427/255.2 |
| 4,565,747 | 1/1986 | Nakae et al. | 427/255.2 |
| 4,582,764 | 4/1986 | Allerd et al. | 350/1.7 |

Primary Examiner—John K. Corbin
Assistant Examiner—Martin Lerner
Attorney, Agent, or Firm—James Magee, Jr.; James C. Davis, Jr.

[57] ABSTRACT

Optically non-scattering films of titanium dioxide for use in optical elements are prepared by overcoating a non-scattering layer of titanium dioxide with an amorphous layer of silicon dioxide at a temperature which is below the crystallization temperature of the non-scattering film of titanium dioxide. Titanium dioxide and silicon dioxide layers can be deposited by a fusion chemical vapor deposition technique by pyrolytic decomposition of suitable precursors containing the necessary constituents of the respective film layers.

4 Claims, 1 Drawing Sheet

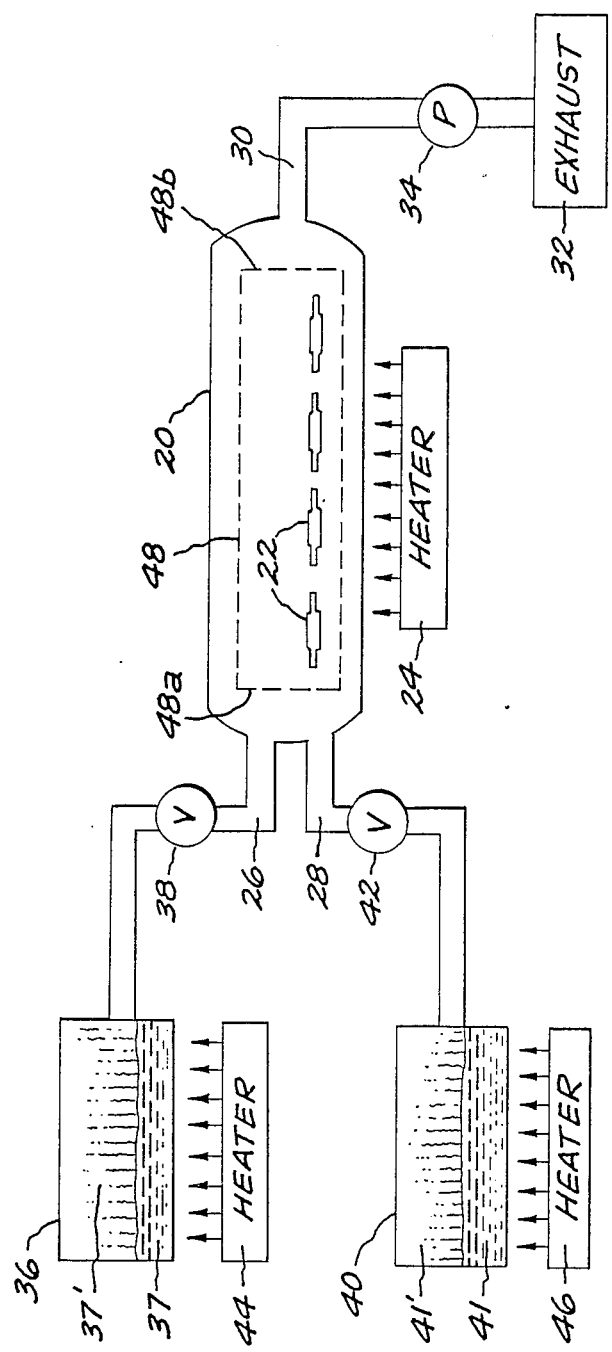

OPTICAL SCATTERING FREE METAL OXIDE FILMS AND METHODS OF MAKING THE SAME

FIELD OF THE INVENTION

The present invention is directed to optical scatter resistant metal oxide films which can be used in the manufacture of dielectric multilayer optical components, for example, infrared mirrors for incandescent lamps.

BACKGROUND OF THE INVENTION

Thin films of metal oxides (e.g., titanium dioxide) have been used in the manufacture of high temperature optical components such as band pass filters. Such films can be deposited by chemical vapor deposition methods such as are described in, for example, U.S. Pat. Nos. 4,006,481 and 4,211,803.

While such films in the as-deposited state do not exhibit scattering at ambient or slightly elevated temperatures, scattering does take place after use at elevated temperatures adversely affecting optical performance. It is therefore desirable to prevent the development of optical scattering after use at elevated temperatures in optical elements used for the production of infrared mirrors for incandescent lamps and other optical elements which benefit from low scattering under usual use conditions.

Applicants' have discovered that metal oxide films which do not scatter radiation in the as-deposited state develop a tendency to scatter after high temperature use and that overcoating of the metal oxide film with a layer of amorphous silicon dioxide preserves the non-scattering character of the as-deposited metal oxide layer.

In a preferred embodiment of the invention, the metal oxide is titanium dioxide which is preferably deposited by the chemical vapor deposition from titanium tetraethoxide. In another preferred feature of the invention, the metal oxide film and the silicon dioxide layer are deposited by use of an effusion cell arranged in flow communication with the deposition chamber to enable blending of the metal oxide and the silicon dioxide at their interface in order to provide improved adhesion and reduce stress at the interface by avoiding an abrupt interface.

It is therefore an object of the invention to provide an amorphous silicon dioxide coated metal oxide film which is substantially free of optical scattering at elevated temperatures.

One of the objects of this invention is to provide optically nonscattering films of titanium dioxide.

Another object of the invention is to provide a method for preventing the development of a radiation scattering microstructure in chemical vapor deposited titanium dioxide films.

Still another object of the invention is to provide a method for making non-scattering composites comprising titanium dioxide and silicon dioxide layers.

SUMMARY OF THE INVENTION

The present invention is directed to an optical element characterized by reduced light scattering after use at elevated temperatures comprising a metal oxide film having thereon a coating layer of amorphous silicon dioxide and to methods for preserving the non-scattering characteristics of the as-deposited layer of metal oxide. Titanium dioxide is a preferred metal oxide.

In a preferred form of the invention, the metal oxide film and the silicon dioxide coating are preferably deposited by an effusion chemical vapor deposition process which permits controlled deposition of the metal oxide and the silicon dioxide.

BRIEF DESCRIPTION OF THE DRAWING

The sole FIGURE is an amplified schematic view of an exemplary apparatus useful in carrying out a preferred method of depositing silicon dioxide coating on a metal oxide film.

DETAILED DESCRIPTION OF THE INVENTION

The optical element produced in accordance with the present invention includes a substrate, a metal oxide film on the substrate and an amorphous silicon dioxide coating on the metal oxide film.

The substrates include any materials on which metal oxide films can be deposited and which are capable of withstanding the temperatures encountered in the deposition chamber, e.g. up to about 500° C. Typical examples of such substrates include silicon, glasses such as boron glass, silicon glass, metals and metal alloys.

The metal oxide of which the film is formed can be selected from metal oxides which are suitable for optical elements including oxides of the Group IV(B) to VI(B) elements such as titanium, tantalum, molybdenum and the like. Titanium dioxide is especially preferred as the film forming metal oxide.

The optical element of the present invention may be prepared by pyrolytic decomposition of a precursor for the metal oxide in a chemical vapor deposition apparatus containing a suitable substrate to form a metal oxide film on the substrate. Suitable chemical vapor deposition teqhniques are known in the art and are disclosed in, for example, U.S. Pat. Nos. 4,006,481; 4,211,803; 4,393,097; 4,435,445; 4,508,054; and 4,565,747 incorporated herein by reference.

By way of example, a film of titanium dioxide may be deposited by pyrolytic decomposition of titanium tetraethoxide or titanium isopropoxide in a chemical vapor deposition chamber. Other metal oxide precursors include tantalum pentaethoxide, zirconium ethoxide, niobium ethoxide and the like.

Thereafter, prior to exposure of the metal oxide layer to crystalization temperatures, i.e., above about 600° C., the metal oxide film is overcoated with a layer of amorphous silicon dioxide using similar known pyrolytic deposition techniques. The terms "pyrolytically deposited" and "pyrolytic deposition", as used herein, refer to chemical vapor deposition techniques and includes both vapor phase and solid phase reactions.

As previously stated, the interface between the metal oxide film and the silicon dioxide layer can be formed in such a way that there is a gradual composition change ranging from metal oxide to silicon dioxide through varying blend ratios of the metal and silicon oxides. To accomplish this, it is desirable to employ a deposition apparatus containing two or more effusion cells. More specifically, the substrate is positioned within the deposition chamber. An effusion cell, arranged in controllable flow communication with the deposition chamber, is also provided and contains an organometallic reagent including all the constituent atoms of a desired deposition film product and a predetermined number of bonds per reagent metal atom that is desired to have remain intact in the final deposition product, such number being at least as high in value as the ratio of anion to metal atoms in the final film product. The vapor pressure of the reagent is increased by heating the effusion cell in which the reagent is situated. The deposition chamber is evacuated to a pressure below the reagent vapor pressure in the effusion cell to promote effusion of the reagent into the deposition chamber. The chamber is raised in temperature to induce pyrolytic deposition onto the substrate of any reagent introduced into the deposition chamber. To commence the film formation process, flow communication is established between the effusion cell and the deposition chamber, whereupon the reagent from the effusion cell effuses into the deposition chamber, the reagent being pyrolytically deposited onto the substrate as a binary compound film.

The same procedure is followed using a second effusion cell containing a silicon dioxide precursor in order to deposit the silicon dioxide layer. Suitable silicon dioxide precursors include those silicon and oxygen containing compounds which have a pyrolytic decomposition temperature below the crystallization temperature of the titania film, e.g., below about 600° C. for a 20,000 angstrom film. Illustrative compounds are, diacetoxydibutoxy silane, tetraacetoxy silane, and silicon tetrakis diethyloxyamine.

No carrier gas is required in the deposition chamber to facilitate movement of reagent through the chamber, although the present method is not incompatible with the use of a carrier gas. Further, the film-formation process does not require use of a reactive gas other than an organometallic reagent as described above.

The organometallic reagent used in the foregoing film-forming method may comprise, by way of example, tantalum pentaethoxide for formation of a film of tantalum pentoxide; titanium tetraethoxide or titanium isopropoxide to form a film of titanium dioxide; and niobium pentaethoxide to form a film of niobium pentoxide and the like.

A second effusion cell is provided in controllable flow communication with the deposition chamber and contains the silicon dioxide precursor from which the silicon dioxide is deposited on the metal oxide film in a like manner.

The effusion chemical vapor deposition method is particularly well suited for the formation of uniform films on refractory substrates, such as the dielectric materials silicon, silicon dioxide glass, or boron glass, or on metallic substrates, such as metal or metal alloy. The films, which are thin (i.e., typically below 10,000 Angstroms) and uniform within plus or minus about 5 percent, have been successfully deposited on curvilinear substrates with low radii of curvature, viz., from about 0.1 to about 5 centimeters, as described in the titanium dioxide and silicon dioxide film-formation examples set forth below.

Apparatus for carrying out the film-formation procss is illustrated schematically in the sole FIGURE. The apparatus includes a deposition chamber 20 containing one or more substrates 22 onto which films are pyrolytically deposited. A heat source 24 is used to control the rate of film formation on substrates 22. In flow communication with deposition chamber 20 are two valved inlet ports 26 and 28, discussed below, and an outlet port 30, through which any used precursor and gaseous reaction products are transported to an exhaust chamber 32 by means of a pump 34.

By having two inlet ports 26 and 28 to deposition chamber 20, two different types of film may be formed on substrates 22 in a single manufacturing batch. Inlet port 26 is connected to a first effusion cell 36 via a valve 38. Inlet port 28 is connected to a second effusion cell 40 via a valve 42. Effusion cells 36 and 40 are partially filled, respectively, with organometallic reagents 37 and 41; the phrase "organometallic reagents" signifying herein organic compounds of metal such as titanium tetraethoxide. Reagents 37 and 41 each contain all the constituent atoms of the desired, respective deposition film products produced therefrom and each contain a predetermined number of bonds per reagent metal atom that is desired to have remain intact in the respective final deposition products. Such number is at least as high in value as the ratio of anion to metal atoms desired in the final film products. To facilitate the effusion or gasification of reagents 37 and 41 into gases, schematically illustrated as gases 37' and 41', respectively, effusion cells 36 and 40 are respectively provided with heaters 44 and 46.

Effusion of reagents 37 and 41 into deposition chamber 20 proceeds by means of evacuating the deposition chamber and stimulating effusion of reagents 37 and 41 into gases 37' and 41', respectively, by raising the vapor pressures of the reagents. In particular, deposition chamber 20 is suitably evacuated to a pressure preferably between about 10 and about 500 microns Hg, with an alternative upper pressure limit being about 2,000 microns Hg, by way of example. The vapor pressure of organometallic reagents 37 and 41 is increased through heating of the reagents by heaters 44 and 46, respectively. Valves 38 and 42 are then controlled as so that only one of gaseous reagents 37' and 41' is transported by effusion into deposition chamber 20. Once inside chamber 20, some part of gaseous reagent 37' or 41' produces a pyrolytic deposit onto substrates 22 at a rate determined by the substrate temperature, which is controlled by heater 24. Within deposition chamber 20, a reaction zone 48 (schematically illustrated) constitutes a volume the temperature of which has been uniformly raised to a point by heater 24 that effused organometallic reagent in such volume pyrolytically deposits onto any exposed surface therein. Any unused reagent is transported to exhaust chamber 32 by means of pump 34 and, if desired, may be recycled.

In particular regard to deposition binary compound films of titanium dioxide and silicon dioxide on substrates 22, examples of carrying out the process are described as follows.

Suitable organometallic reagents 37 and 41 respectively comprise titanium tetraethoxide to produce a titanium dioxide film and tetraacetoxy silane to produce silicon dioxide film. A beneficial characteristic of the foregoing reagents is that each can be vaporized into an effusive state at a temperature no greater than about 200° C., which is a typical upper limit for readily-available equipment used in chemical vapor deposition processes. Reagents that effuse at higher temperatures require higher temperature equipment that may not be as readily available.

To increase the reagent vapor pressure in effusion cells 36 and 40, the titanium tetraethoxide reagent 37 is raised in temperature by heater 44 to about 120° C., for example, and the silicon tetraacetoxy silane reagent 41 is raised in temperature by heater 46 to about 100° C., for example. To maintain each of reagents 37 and 41 in an effusive state during its transport to deposition chamber 20, inlet ports 26 and 28 and the associated plumbing that interconnects effusion chambers 36 and 41 with deposition chamber 20 are suitably maintained at 120° C., for example.

To control the deposition rate of titanium dioxide film on substrates 22, the temperature of deposition chamber 20 is increased by heater 24 to the point where substrates 22 are at a temperature of 440° C. for example. Deposition chamber 20 is evacuated to a pressure of 100 microns Hg, for example, and then titanium tetraethoxide reagent 37 is permitted to effuse into deposition chamber upon opening of valve 38. The reagent effusion rate is controlled by both heating of effusion chamber 36 and adjustment of valve 38. By way of example, reagent effusion rate of about 10 grams in about 60 minutes is achieved with the foregoing substrate temperature and deposition chamber pressure through use of a 5-centimeter diameter tubular deposition chamber 20 containing a 15-centimeter heated reaction zone 48, in which zone substrates 2 are situated. With the foregoing reagent effusion rate, the linear velocity of reagent through deposition chamber is about 200 centimeters per second.

Deposition of titanium dioxide onto substrates 22 occurs until the desired thickness of the titanium dioxide film has been achieved and effusion of reagent has been terminated. Film thickness ranging from about 100 to about 20,000 Angstroms may be formed, by way of example.

The titanium dioxide becomes deposited by pyrolytic reaction on substrates 22, while the by-products of the pyrolytic reaction are exhausted from deposition chamber 20 via pump 34. Termination of titanium dioxide deposition results from closure of valve 38.

Preparation for deposition of a silicon dioxide film onto the titanium dioxide film-coated substrates is carried out by evacuating deposition chamber 20 to a pressure of 500 microns Hg, for example, and adjusting heater 24 so that the temperature of substrates 22 is 550° C., for example. Valve 42 is then opened to such an extent as to permit effusion of tetraacetoxy silane reagent 41 from effusion cell 40 into deposition chamber 20 at a linear velocity of 200 centimeters per second for a 5-centimeter diameter deposition chamber 20 such as utilized in the above titanium dioxide film-formation example. Where chamber 20 has a 15-centimeter heated reaction zone 48 in which substrates 22 are situated and substrate temperatures and deposition chamber pressure are as specified, the foregoing 25. linear velocity of reagent corresponds to a reagent effusion rate of about 10 grams in about 60 minutes. The rate of deposition of silicon dioxide onto the titanium dioxide coated substrates 22 is about 1500 A in 20 minutes. Films of silicon dioxide ranging from about 100 to about 20,000 A may be formed, by way of example. The silicon dioxide is deposited by pyrolytic reaction on titanium dioxide coated substrates 22 while the by-products of the pyrolytic reaction are exhausted from deposition chamber 20 by pump 34.

What is claimed is:

1. A method for preventing optical scattering resulting from crystallization of a thin film of titanium dioxide which comprises chemical vapor deposition of nonscattering titanium dioxide film by pyrolytic decomposition of a member selected from the group consisting of titanium tetraethoxide and titanium isopropoxide and overcoating the titanium dioxide film with a layer of amorphous silicon dioxide at a temperature below the crystallization temperature of the titanium dioxide film.

2. The process of claim 1 wherein the amorphous silicon dioxide is deposited at a temperature below about 600° C.

3. The process of claim 1 which comprises pyrolytic decomposition of titanium tetraethoxide.

4. The process of claim 1 which comprises pyrolytic decomposition of titanium isopropoxide.

* * * * *